(12) United States Patent
Cooper

(10) Patent No.: US 6,215,424 B1
(45) Date of Patent: Apr. 10, 2001

(54) SYSTEM FOR VARIABLE LENGTH CODEWORD PROCESSING SUITABLE FOR VIDEO AND OTHER APPLICATIONS

(75) Inventor: Jeffrey Allen Cooper, Indianapolis, IN (US)

(73) Assignee: Thomson Licensing S.A., Boulogne, Cedex (FR)

( * ) Notice: Subject to any disclaimer, the term of this patent is extended or adjusted under 35 U.S.C. 154(b) by 0 days.

(21) Appl. No.: 09/213,041

(22) Filed: Dec. 16, 1998

(51) Int. Cl.$^7$ ........................................... H03M 7/40
(52) U.S. Cl. ................................. 341/67; 341/65
(58) Field of Search ...................... 341/50, 63, 67, 341/65, 106

(56) References Cited

U.S. PATENT DOCUMENTS

| | | |
|---|---|---|
| 5,225,832 | 7/1993 | Wang et al. ............................ 341/67 |
| 5,557,271 * | 9/1996 | Rim et al. ............................... 341/67 |
| 5,561,690 * | 10/1996 | Park ..................................... 375/340 |
| 5,650,905 | 7/1997 | Bakhmutsky ........................... 341/67 |
| 5,686,916 | 11/1997 | Bakhmutsky ........................... 341/67 |
| 5,696,506 * | 12/1997 | Yu ......................................... 341/67 |
| 5,710,561 * | 1/1998 | Schmidt et al. ....................... 341/63 |
| 5,736,945 * | 4/1998 | Kinouchi et al. ..................... 341/63 |
| 5,901,177 * | 5/1999 | Sohn ................................... 375/240 |
| 6,011,498 * | 1/2000 | Wittig ................................... 341/67 |

FOREIGN PATENT DOCUMENTS

| | | | |
|---|---|---|---|
| 655842 * | 11/1994 | (EP) | ............................. H03M/7/42 |
| 798931A2 | 10/1997 | (EP) | ............................. H04N/7/50 |
| 97/24809 | 7/1997 | (WO) | ............................. H03M/7/40 |
| 97/24811 | 7/1997 | (WO) | ............................. H03M/7/42 |
| 98/00924 | 1/1998 | (WO) | ............................. H03M/7/40 |
| 98/28711 | 7/1998 | (WO) | ............................. H03M/7/40 |

OTHER PUBLICATIONS

Y. Jan, *A High Speed Variable Length Decoder For Digital HDTV System, Signal Processing of HDTV, IV;* Japan, Nov. 1992, pp. 333–340.

* cited by examiner

*Primary Examiner*—Michael Tokar
*Assistant Examiner*—Peguy JeanPierre
(74) *Attorney, Agent, or Firm*—Joseph S. Tripoli; Ronald H. Kurdyla; Alexander J. Burke

(57) ABSTRACT

A variable length codeword decoder is responsive to a clock signal having multiple cycles and includes a source of sequential variable length codewords, each representing a run-length encoded codeword. A barrel shifter circuit is coupled to the codeword source and provides the next undecoded variable length codeword in lesser significant bits of its output terminal. A codeword decoding circuit is coupled to the output terminal of the barrel shifter and operates to decode two sequential variable length codewords, representing respective zero run run-length codewords, in a single clock cycle; or two sequential variable length codewords, a first representing a zero run run-length codeword and a second representing a one run run-length codeword, in a single clock cycle; and all other variable length codewords in a single clock cycle.

16 Claims, 5 Drawing Sheets

| Zero run variable length codeword | Table output |
|---|---|
| MPEG2, Intra, Acfirst, CD[14:0] | Length |
| -001 ---- ---- ---- -- | 00011 |
| -0-0 100- ---- ---- -- | 00101 |
| -0-0 0101 ---- ---- -- | 00110 |
| -0-0 0001 10-- ---- -- | 01000 |
| -0-0 0100 110- ---- -- | 01001 |
| -0-0 0100 001- ---- -- | 01001 |
| -0-0 0000 0101 0--- -- | 01011 |
| -0-0 0000 0011 101- -- | 01101 |
| -0-0 0000 0011 000- -- | 01101 |
| -0-0 0000 0010 011- -- | 01101 |
| -0-0 0000 0010 000- -- | 01101 |
| -0-0 0000 0001 1010 -- | 01110 |
| -0-0 0000 0001 100- -- | 01110 |
| -0-0 0000 0001 0111 -- | 01110 |
| ---0 0000 0000 1--- -- | 01111 |
| ---0 0000 0000 0110 00 | 10000 |
| ---0 0000 0000 010- -- | 10000 |
| -1-1 0--- ---- ---- -- | 00111 |
| -1-1 10— ---- ---- -- | 00100 |
| -1-0 111- ---- ---- -- | 00101 |
| -1-1 110- ---- ---- -- | 00110 |
| -1-0 0010 ---- ---- -- | 00111 |
| -1-1 1110 11-- ---- -- | 01000 |
| -1-1 1111 00-- ---- -- | 01000 |
| -1-0 0100 01-- ---- -- | 01001 |
| -1-1 1111 01-- ---- -- | 01001 |
| -1-1 1111 11-- ---- -- | 01001 |
| 1--0 0000 1000 000- -- | 11000 |

Fig. 5

| Zero & one run variable length codeword | Table output |
|---|---|
| MPEG2,Intra,ACfirst,CD[0:14] | Length index [14:0] |
| -001 1--- ---- ---- -- | 00 0000 0000 0001 |
| -0-0 100- ---- ---- -- | 00 0000 0000 0100 |
| -0-0 0101 ---- ---- -- | 00 0000 0000 1000 |
| -0-0 0001 10-- ---- -- | 00 0000 0010 0000 |
| -0-0 0100 110- ---- -- | 00 0000 0100 0000 |
| -0-0 0100 001- ---- -- | 00 0000 0100 0000 |
| -0-0 0000 0101 0--- -- | 00 0000 1000 0000 |
| -0-0 0000 0011 101- -- | 00 0001 0000 0000 |
| -0-0 0000 0011 000- -- | 00 0001 0000 0000 |
| -0-0 0000 0010 011- -- | 00 0001 0000 0000 |
| -0-0 0000 0010 000- -- | 00 0001 0000 0000 |
| -0-0 0000 0001 1010 -- | 00 0010 0000 0000 |
| -0-0 0000 0001 100- -- | 00 0010 0000 0000 |
| -0-0 0000 0001 0111 -- | 00 0010 0000 0000 |
| ---0 0000 0000 1--- -- | 00 0100 0000 0000 |
| ---0 0000 0000 0110 00 | 00 1000 0000 0000 |
| ---0 0000 0000 010- -- | 00 1000 0000 0001 |
| -1-1 0--- ---- ---- -- | 00 0000 0000 0001 |
| -1-1 10-- ---- ---- -- | 00 0000 0000 0010 |
| -1-0 111- ---- ---- -- | 00 0000 0000 0100 |
| -1-1 110- ---- ---- -- | 00 0000 0000 1000 |
| -1-0 0010 ---- ---- -- | 00 0000 0001 0000 |
| -1-1 1110 11-- ---- -- | 00 0000 0010 0000 |
| -1-1 1111 00-- ---- -- | 00 0000 0010 0000 |
| -1-0 0100 01-- ---- -- | 00 0000 0100 0000 |
| -1-1 1111 01-- ---- -- | 00 0000 0100 0000 |
| -1-1 1111 11-- ---- -- | 00 0000 0100 0000 |
| 1--0 0000 1000 000- -- | 10 0000 0000 0000 |
| -0-0 11-- ---- ---- -- | 00 0000 0000 0010 |
| -0-0 0011 0--- ---- -- | 00 0000 0001 0000 |
| -0-0 0100 101- ---- -- | 00 0000 0100 0000 |
| -0-0 0000 0110 0--- -- | 00 0000 1000 0000 |
| -0-0 0000 0011 011- -- | 00 0001 0000 0000 |
| ---0 0000 0001 0110 -- | 00 0010 0000 0000 |
| ---0 0000 0001 0101 -- | 00 0010 0000 0000 |
| ---0 0000 0000 0111 -- | 00 1000 0000 0000 |
| ---0 0000 0000 0110 1- | 00 1000 0000 0000 |
| ---0 0000 0000 0110 01 | 00 1000 0000 0000 |
| ---0 0000 0000 0010 0- | 01 0000 0000 0000 |
| -1-0 10-- ---- ---- -- | 00 0000 0000 0010 |
| -1-0 0110 ---- ---- -- | 00 0000 0000 1000 |
| -1-1 1110 01-- ---- -- | 00 0000 0010 0000 |
| -1-0 0100 111- ---- -- | 00 0000 0100 0000 |
| -1-0 0100 000- ---- -- | 00 0000 0100 0000 |
| 1--0 0000 1000 001- -- | 10 0000 0000 0000 |

Fig. 6

SYSTEM FOR VARIABLE LENGTH CODEWORD PROCESSING SUITABLE FOR VIDEO AND OTHER APPLICATIONS

FIELD OF THE INVENTION

The present invention relates to a decoder for decoding successive variable length codewords encoding run length encoded coefficients. In particular, the present invention relates to a variable length decoder (VLD) which may be used for decoding variable length codewords in a high definition television (HDTV) video data signal which has been encoded according to the Motion Pictures Expert Group (MPEG) international standard.

BACKGROUND OF THE INVENTION

In the United States, a standard has been proposed for digitally encoding high definition television signals. This standard is essentially the same as the MPEG2 standard, proposed by the Moving Picture Experts Group (MPEG) of the Inter national Standards Organization (ISO). This standard is referred to herein as the MPEG standard and signal conforming to this standard are referred to as MPEG or MPEG encoded signals. This standard is described in a draft internal standard (DIS) publication entitled "Information Technology—Generic Coding of Moving Pictures and Associated Audio, Recommendation H.262 ISO/IEC 13818.2; 1995 (E) available from the ISO and incorporated by reference.

The MPEG2 video signal encoding standard specifies encoding video data representing an image into binary (digital) data consisting mostly of blocks of discrete cosine transfer (DCT) coefficients. These coefficients are run length encoded into fixed size run length codewords. Each run length encoded codeword is then Huffman encoded into variable length code words. In an MPEG encoded HDTV signal, blocks of DCT coefficients must be decoded at a predetermined rate in order to properly decode and display the image being transmitted. The instantaneous rate can vary depending upon the detail and motion in the image. However, there is a maximum rate at which run length encoded codewords, and thus variable length code words, occur for a 'worst case' image. This rate exceeds 100 million code words per second. Various methods have been proposed to decode codewords at this rate.

Variable length decoders (VLDs) have been proposed in which have the capability of decoding multiple variable length codewords simultaneously in a single clock cycle, under the proper conditions. In prior art VLDs, a number of bits of the received encoded signal are supplied in parallel to the decoding section of the VLD via a barrel shifter. Such a VLD is termed a parallel decoder. The number of bits is selected to be at least the number of bits in the maximum sized variable length codeword. These bits are supplied to a lookup table (LUT), preconfigured with entries for each allowed variable length codeword. Each entry in the LUT contains the value of the run length codeword represented by the variable length codeword, and the length (i.e. the number of bits) of the variable length codeword. As a codeword is decoded, the number of parallel bits in the newly decoded variable length codeword are shifted out of the barrel shifter, and the remaining bits in the barrel shifter are shifted into their place. If necessary, the next bits in the digital bit stream are inserted into the barrel shifter. Then the remaining bits in the barrel shifter are processed to decode the next codeword. Such a VLD can decode a single variable length codeword in a single clock cycle.

However, as described above, for MPEG encoded HDTV signals, the maximum rate at which variable length codewords must be decoded is over 100 million per second. This requires a clock frequency of over 100 MHz. Operating at this frequency is currently beyond the capability of the integrated circuitry which is practical for consumer electronics. Thus, a VLD has been proposed which can decode more than one codeword per clock cycle. This would allow a VLD to be implemented which can operate with a clock signal rate below the 100 MHz rate which would be required in the circuitry described above.

In U.S. Pat. No. 5,225,832, entitled "High Speed Variable Length Decoder", issued Jul. 6, 1993 to Wang et al., a parallel VLD is disclosed. In Wang et al., it is recognized that because the variable length codewords vary in length, it is possible that more than a single variable length codeword may fit within the number of bits in the maximum sized variable length codeword. The decoding LUT includes further entries for combined short codewords. Thus, should two shorter codewords be present simultaneously at the output of the barrel shifter, the two codewords will be recognized by the LUT and decoded simultaneously. This allows the VLD to decode at a rate higher than one codeword per clock cycle. The increase over the single-codeword-per-clock-cycle is further increased because shorter codewords are statistically more likely to occur than longer ones. This increase of decoding rate comes at the expense of increased complexity of the decoding LUTs.

It has also been suggested that the width of the output from the barrel shifter be increased to produce two maximum sized variable length codewords simultaneously. This doubled width barrel shifter output is supplied to an LUT which will recognize two codewords simultaneously. A first portion of the LUT recognizes the first variable length codeword, and a second portion recognizes the second variable length codeword. The LUT produces three output values: a first value represents the first variable length codeword, a second value represents the second variable length codeword, and a third value represents the length of the combined two codewords. Such an arrangement would enable the VLD to operate at a clock rate of around 50 MHz, which is well within the practical range. However, the LUT in such an arrangement is very large, compared to that in the single variable length codeword per clock cycle arrangement. For each codeword entry in the first portion of the LUT, the LUT must include circuitry for looking up the complete set of codewords for the second portion. If there are n allowable codewords, there must be n squared entries. This makes the LUT large and slow in operation.

In an article, "Pair-Match Huffman Transcoding to Achieve a Highly Parallel Variable Length Decoder with Two-Word Bit Stream Segmentation" by Bakhmutsky, published in the SPIE Proceedings, Volume 3021, pages 247–265, an enhancement to the parallel VLD of the type disclosed in Wang et al. is disclosed. The VLD of Bakhmutsky can decode at least two DCT coefficients per clock cycle. Bakhmutsky recognizes that the output of the VLD is a series of fixed length run length encoded codewords, each corresponding to a received variable length codeword. Each run length codeword represents one or more DCT coefficients, and includes a run portion and a value portion. The run portion represents the number of zero valued DCT coefficients before the coefficient represented by the current code word. The value portion represents the value of the non-zero DCT coefficient following the run of zero valued coefficients.

Bakhmutsky recognized that a zero run run-length codeword, represented by a single variable length codeword, represents only a single coefficient value (i.e. zero zero-valued coefficients), and that a one run run-length codeword, represented by a single variable length codeword, represents two coefficients: one zero-valued coefficient, and one non-zero valued coefficient. Should two variable length codewords representing two respective zero run run-length codewords, each representing a single coefficient, occur sequentially, they must be decoded simultaneously in a single clock cycle in order to maintain the two coefficient per clock cycle decoding rate. Furthermore, a variable length codeword representing a zero run run-length code (i.e. one coefficient) followed by a variable length codeword representing a one run run-length codeword (i.e. two coefficients) must also be decoded simultaneously in a single clock cycle in order to maintain the two coefficient per clock cycle decoding rate. If this were not done, that is, if each were separately decoded in one clock cycle, then three coefficients would be decoded in two clock cycles (i.e. 1.5 coefficients per clock cycle), which would drop below the goal of two coefficients per clock cycle. In all other cases, a single variable length codeword can be decoded in a single clock cycle and still maintain the goal of at least two coefficients per clock cycle.

In the MPEG encoding scheme, any run-length codeword may be represented by a variable length codeword having a size of up to 24 bits wide (e.g. an escape sequence). This is the maximum size that an MPEG variable length codeword can be. Thus, two sequential variable length codewords can, potentially, be 48 bits wide. Bakhmutsky proposed to analyze the input signal to the VLD, and to replace the variable length codewords representing zero run and one run run-length codes with respectively different codewords having fewer bits in such a manner that two sequential transcoded codewords can appear simultaneously at the output of the VLD barrel shifter. The LUT is modified to recognize the transcoded codewords and decode them simultaneously. In this manner, the Bakhmutsky system can recognize and decode two variable length codewords representing two sequential zero run run-length codewords, or a zero run run-length codeword followed by a one run run-length codeword in a single clock cycle, and thus maintain a two coefficient per clock cycle decoding rate.

The Bakhmutsky system, however, requires the addition of a transcoder in the signal path before the VLD, and the modification of the VLD LUTs to recognize and process two sequential transcoded codewords simultaneously. A system which can maintain a decoding rate of at least two coefficients per VLD clock cycle, without requiring additional decoding or transcoding circuits, and without requiring look up tables in which n squared entries are required for n variable length codewords is desirable.

SUMMARY OF THE INVENTION

In accordance with principles of the present invention, a variable length codeword decoder is responsive to a clock signal having multiple cycles and includes a source of sequential variable length codewords, each representing a run-length encoded codeword. A barrel shifter circuit is coupled to the codeword source and provides the next undecoded variable length codeword in lesser significant bits of its output terminal. A codeword decoding circuit is coupled to the output terminal of the barrel shifter and operates to decode two sequential variable length codewords, representing respective zero run run-length codewords, in a single clock cycle; or two sequential variable length codewords, a first representing a zero run run-length codeword and a second representing a one run run-length codeword, in a single clock cycle; and all other variable length codewords in a single clock cycle.

BRIEF DESCRIPTION OF THE DRAWING

In the drawing:

FIGS. 5 and 6 are tables representing the contents of look up tables in the VLD illustrated in FIGS. 1 through 4;

DETAILED DESCRIPTION

Figure 1:
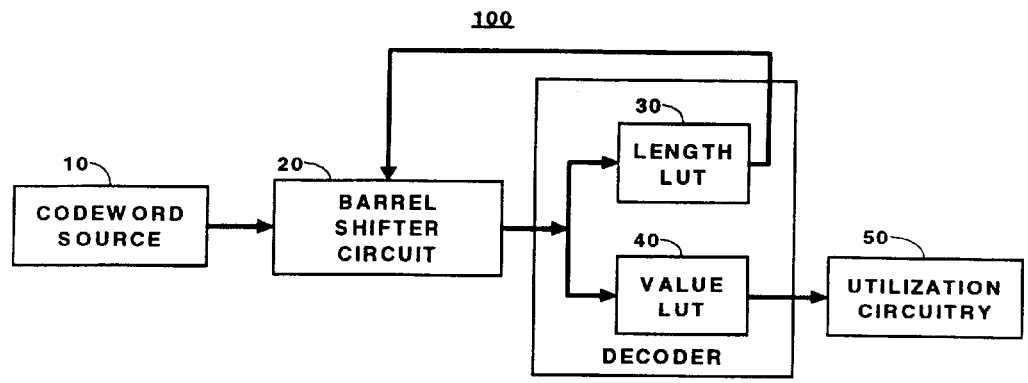
FIG. 1 is a block diagram of a variable length decoder (VLD) system in accordance with the present invention.

FIG. 1 is a block diagram of a variable length decoder (VLD) system 100 in accordance with the present invention. Only those elements necessary to understand the implementation and operation of the invention are illustrated. One skilled in the art will understand what other elements are required, and how to design, implement and interconnect those elements with the illustrated elements. Specifically, a source of a clock signal having multiple cycles is not illustrated. In the illustrated embodiment, this clock signal is supplied to the illustrated elements in a known manner and is in the form of a series of clock cycles repeating at around a 50 MHz rate. As alluded to above, and described below, this permits a decoder according to the present invention to decode coefficients at a minimum of 100 million per second, supporting the MPEG2 coding standard.

In FIG. 1, a variable length codeword source 10 produces a sequence of variable length codewords. The codeword source 10 may include radio frequency signal receiving and processing circuitry, and digital signal processing circuitry, arranged in a known manner. At the output of the codeword source is a first-in-first-out (FIFO) memory output buffer (not shown) also in a known manner. An output terminal of a codeword source 10 is coupled to a data input terminal of a barrel shifter circuit 20. The barrel shifter circuit 20 may be implemented in any of the known arrangements, such as a register arrangement, a state machine, a sequencing circuit, a configurable logic array, or a processor programmed to perform the barrel shifting function. An output terminal of the barrel shifter circuit 20 is coupled to respective input terminals of a codeword length look up table (LUT) 30 and a codeword value LUT 40. The codeword length LUT 30 and codeword value LUT 40, in combination, form a codeword decoder. An output terminal of the length LUT 30 is coupled to a control input terminal of the barrel shifter circuit 20. An output terminal of the codeword value LUT 40 produces a sequence of fixed length run length encoded code words, and is coupled to an input terminal of utilization circuitry 50. The utilization circuitry 50 includes a run length code decoder, and further digital signal processing circuitry. It may also include an image display device and audio reproduction devices, such as speakers, and circuitry responsive to the digital signal processing circuitry, for generating signals representing an image to be displayed on the image display device, and sounds to be reproduced in the audio reproduction devices, all in a known manner.

In operation, the VLD 100 of FIG. 1 receives the sequence of variable length codewords from the codeword source 10. The barrel shifter circuit 20 receives a number of bits in parallel. In the illustrated embodiment, 159 bits are supplied to the barrel shifter circuit from the codeword source 10, in a manner to be described in more detail below. The output of the barrel shifter 20 is also a number of bits in parallel. This number of bits is sufficient to contain at least a first variable length codeword, which is to be decoded next, and a second variable length codeword, which is to be decoded after the first variable length codeword, simultaneously. In the illustrated embodiment, the barrel shifter circuit 20 produces 48 bits, capable of supplying two escape sequences of 24 bits each simultaneously, also in a manner to be described in more detail below.

The barrel shifter circuit 20 operates to always maintain the first variable length codeword, next to be decoded, at one end of the output terminal of the barrel shifter circuit 20, and the second variable length codeword at a location in the output terminal of the barrel shifter circuit 20 adjacent to first variable length codeword. The first codeword at the end of the barrel shifter circuit 20 is recognized and decoded by the length LUT 30 and value LUT 40. The length LUT 30 generates an output representing the length of the recognized code word. The value LUT 40 generates an output representing the fixed length run length codeword corresponding to the recognized variable length codeword. When the codeword is decoded, the barrel shifter circuit 20 is responsive to the length signal from the length LUT 30 to shift the output of the barrel shifter 20 by the length of the decoded codeword so that the next codeword to be decoded is generated at the end of the output terminal of the barrel shifter circuit 20.

The length LUT 30 and value LUT 40 are arranged, in a manner to be described in more detail below, to recognize when the first and second variable length codewords each represent a zero run run-length codeword. When this is recognized, the length LUT 30 produces a signal representing the combined length of the two variable length codewords, and the value LUT 40 produces two successive values representing the two fixed length zero run run-length codewords. The length LUT 30 and value LUT 40 are also arranged, in a manner to be described in more detail below, to recognize when the first variable length codeword represents a zero run run-length codeword and the- second variable length codeword represents a one run run-length codeword. When this is recognized, the length LUT 30 produces a signal representing the combined length of the two variable length codewords, and the value LUT 40 produces two successive values representing the two fixed length run-length codewords.

As described above, by simultaneously recognizing sequential variable length codewords representing respective zero run run-length codewords, or a zero run run-length codeword and a one run run-length codeword, a rate of at least two DCT coefficients per clock cycle is maintained from the combination of the VLD and run-length decoder (not shown). Because the VLD 100 of FIG. 1 maintains a decoding rate of two coefficients per clock cycle, it can operate at a clock rate approximately one half the codeword clock rate of 100 MHz. In the illustrated embodiment, the VLD 100 operates at a clock rate of 54 MHz, which is well within the operating range of integrated circuit technology appropriate for consumer electronic equipment. Furthermore, there is no transcoder required in the illustrated embodiment.

Figure 2:
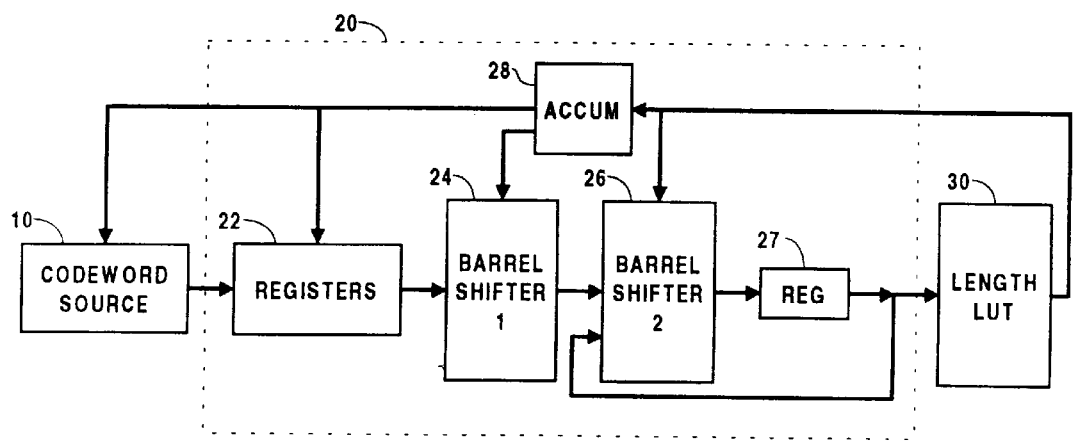
FIGS. 2, 3 and 4 are more detailed block diagrams of respective portions of the VLD system illustrated in FIG. 1.

FIG. 2 is a more detailed block diagram of a portion of the VLD system illustrated in FIG. 1. In FIG. 2, elements which are the same as those in FIG. 1 are designated by the same reference number, and are not described in detail below. In addition, only those elements necessary to the understanding of the present invention are illustrated in order to simplify the figure. One skilled in the art will understand what other elements would be necessary (e.g. registers, flip flops, clock signals etc.) to interconnect the illustrated elements and synchronize their operation, how to implement those elements, and how to connect those elements to the illustrated elements.

In FIG. 2, the output terminal of the codeword source 10 is coupled to an input terminal of a set of registers 22. An output terminal of the registers 22 is coupled to an input terminal of a first barrel shifter 24. An output terminal of the first barrel shifter 24 is coupled to a first input terminal of a second barrel shifter 26. An output terminal of the second barrel shifter 26 is coupled to an input terminal of a register 27. An output terminal of the register 27 is coupled to the input terminal of the length LUT 30, and to a second input terminal of the second barrel shifter 26. An output terminal of the length LUT 30 is coupled to a control input terminal of the second barrel shifter 26 and an input terminal of an accumulator 28. A first output terminal of the accumulator 28 is coupled to a control input terminals of the first barrel shifter 24, and a second output terminal of the accumulator 28 is coupled to respective control input terminals of the registers 22 and the codeword source 10.

In operation, the registers 22 operate to receive data from the codeword source 10, and provide 159 bits in parallel to the first barrel shifter 24. In the illustrated embodiment, the output terminal of the FIFO (not shown) of the codeword source 10 provides 64 bits in parallel. A first and a second cascade 64 bit parallel registers (not shown) are coupled to the output of the codeword source 10. The combined outputs of the registers, consequently, produce 128 bits. Within the registers 22, an additional 31 bits directly from the output of the FIFO of the codeword source 10 are combined with the 128 bits from the first and second registers to form a 159 bit parallel signal from the registers 22 for the first barrel shifter 24. In response to a read control signal from the accumulator (described in more detail below) the output from the first register is latched into the second register, the full 64 bit output from the FIFO (not shown) of the codeword source 10 is latched into the first register, and those 64 bits are shifted out of the FIFO, producing the next 64 bits of variable length codewords at the output of the FIFO.

The first and second barrel shifters 24 and 26 operate together to provide the next undecoded bits to the lesser significant bits of the input terminal of the length LUT 30. More specifically, the second barrel shifter 26 is controlled so that the next undecoded bits are provided at the lesser significant bits of the output terminal. The first barrel shifter 24 operates to align the 159 bits from the codeword source 10 with the trailing edge of the yet undecoded bits in the second barrel shifter 26.

In the illustrated embodiment, the output terminal of the first barrel shifter 24 produces 48 bits. The 48 bits from the first barrel shifter 24 are supplied to the first input terminal of the second barrel shifter 26. The output terminal of the second barrel shifter 26 also produces 48 bits, which, as described above, is sufficient to include two of the longest variable length codewords. Consequently, the second barrel shifter 26 receives 96 bits at its combined first and second input terminals.

At the end of each clock cycle, the 48 bits from the output terminal of the second barrel shifter 26 is latched in the register 27. At the beginning of each clock cycle, the bits from the register 27, representing the contents of the second barrel shifter 26 from the previous clock cycle, are fed back to the second input terminal of the second barrel shifter 26, which forms the lesser significant bits of the input, for processing in the next clock cycle. Simultaneously, the length of the variable length codeword decoded in the previous clock cycle is supplied to the control input terminal of the second barrel shifter 26 from the length LUT 30. The second barrel shifter shifts the bits at the first and second input terminals by the amount specified at its control input terminal, thus shifting out the previously decoded bits, and leaving the next undecoded bits at the lesser significant bits of the output terminal. Because the input to the second barrel shifter 26 is 96 bits, 48 from the register 27 and 48 from the first barrel shifter, the output from the second barrel shifter always has at least 48 valid data bits.

The first barrel shifter 24 operates to align the new data from the registers 22 with the trailing bits of the undecoded data from the second barrel shifter 26. As variable length codewords are recognized and decoded by the length LUT 30, the length of the decoded codewords is supplied to the accumulator 28, which adds that length to the previously accumulated lengths, in a known manner. The accumulated length data is supplied to the control input terminal of the first barrel shifter 24. The first barrel shifter shifts its data by the amount of the accumulated variable length codeword lengths. This aligns the data from the first barrel shifter 24 with the trailing edge of the yet undecoded data in the second barrel shifter 26. Each time the bits from the second register (not shown) in the register set 22 are completely decoded, the accumulator sends a read signal to the registers 22 and the codeword source 10 to latch the next word from the codeword source 10 in the manner described above.

The worst case condition occurs when there is only one undecoded bit left at the output of the second register of the register set 22 and two codewords, each 24 bits long, are decoded. In this case the first barrel shifter 24 must shift its input by 111 bits, that is: 63 bits to fill the second register plus 48 bits in the decoded codeword. When the first barrel shifter 24 shifts by 111 bits, there must be at least 48 bits at its more significant bits for a valid 48 bit output to be supplied to the second barrel shifter 26. For this reason, the input to the first barrel shifter 24 is 159 bits: 111 bits for a worst case shift, plus 48 bits for the output to the second barrel shifter 26.

Figure 3:
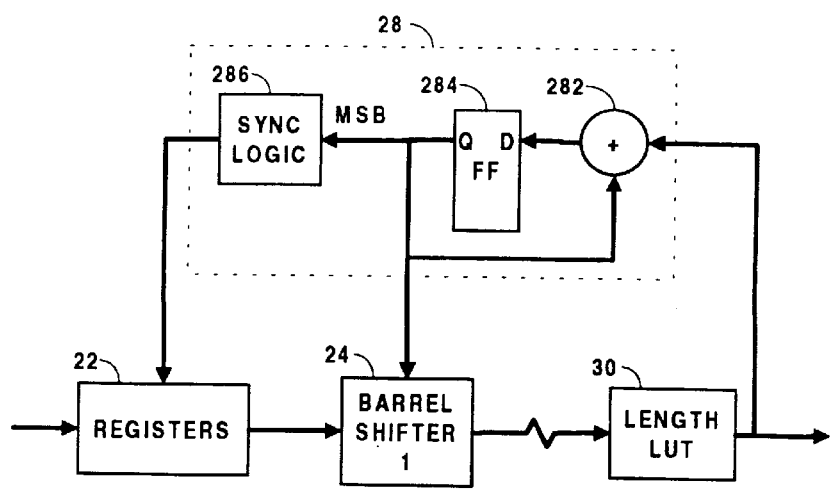

FIG. 3 is a more detailed block diagram of a portion of the VLD system illustrated in FIG. 1. In FIG. 3, elements which are the same as those illustrated in FIG. 1 are designated by the same reference number and are not described in detail below. In FIG. 3, the output terminal of the length LUT 30 is coupled to an addend input terminal of an adder 282. A sum output terminal of the adder 282 is coupled to a D input terminal of a D flip-flop 284. A Q output terminal of the D flip-flop 284 is coupled to an input terminal of a synchronization logic circuit 286, the control input terminal of the first barrel shifter 24 and an augend input terminal of the adder 282. An output terminal of the synchronization logic circuit 286 is coupled to a control input terminal of the register set 22.

In operation, the combination of the adder 282, the D flip-flop 284 and the synchronization logic circuit 286 operate as the accumulator 28 illustrated in FIG. 2. Because the second barrel shifter 26 (not shown) shifts a maximum of 48 bits, the control input requires six bits, consequently, the length LUT 30 produces a length signal having six bits. This six bit output signal is coupled to the second barrel shifter 26 (of FIG. 2) and the adder 282. The sum output terminal of the adder 282 produces a seven bit output signal. This is stored in the D flip-flop which is seven bits wide. This signal is coupled back to the augend input terminal of the adder 282 forming a seven bit accumulator. The output of the D flip-flop 284 is coupled to the control input terminal of the first barrel shifter 24 and controls the number of bits shifted to a maximum of 128, although no more than 111 will ever be required, as described above. The most significant bit (MSB) of the output from the D flip-flop 284 becomes active whenever the amount shifted by the first barrel shifter 24 exceeds 64. In this case, the registers 22 and codeword source 10 (not shown) retrieve a new value from the FIFO in the codeword source, as described in more detail above.

Referring again to FIG. 2, to maintain the processing rate described above of decoding at least two coefficients per clock cycle by simultaneously decoding two sequential variable length codewords representing two zero run or one zero run and one one run run-length codewords per clock cycle, there are three critical paths in the illustrated VLD whose processing must be completed within one clock cycle. First, there is the path from the 159 bit input terminal to the first barrel shifter 24, through the second barrel shifter 26 to the 48 bit register 27. Second, there is the path from the 48 bit register 27, through the length LUT 30, through the adder 282 to the seven bit accumulator D flip-flop 284. Third, there is the path from the 48 bit register 27, through the second barrel shifter 26 and back to the 48 bit register 27. To enable these paths to operate within one clock cycle, the present invention discloses circuit optimizations described below.

In a first optimization, the length LUT 30 is separated from the value LUT 40 (as illustrated in FIG. 1). In this manner, logic optimizations are applied to the length LUT 30 to group the variable length codewords according to their length. The number of entries in the length LUT 30, thus, is decreased, and the latency correspondingly decreased.

In addition, the length LUT 30 is separated into one section for recognizing and decoding consecutive variable length codewords representing two zero run run-length codewords or a zero run run-length codeword followed by a one run run-length codeword, and one section for recognizing and decoding all other variable length codewords. This is illustrated in FIG. 4.

Figure 4:
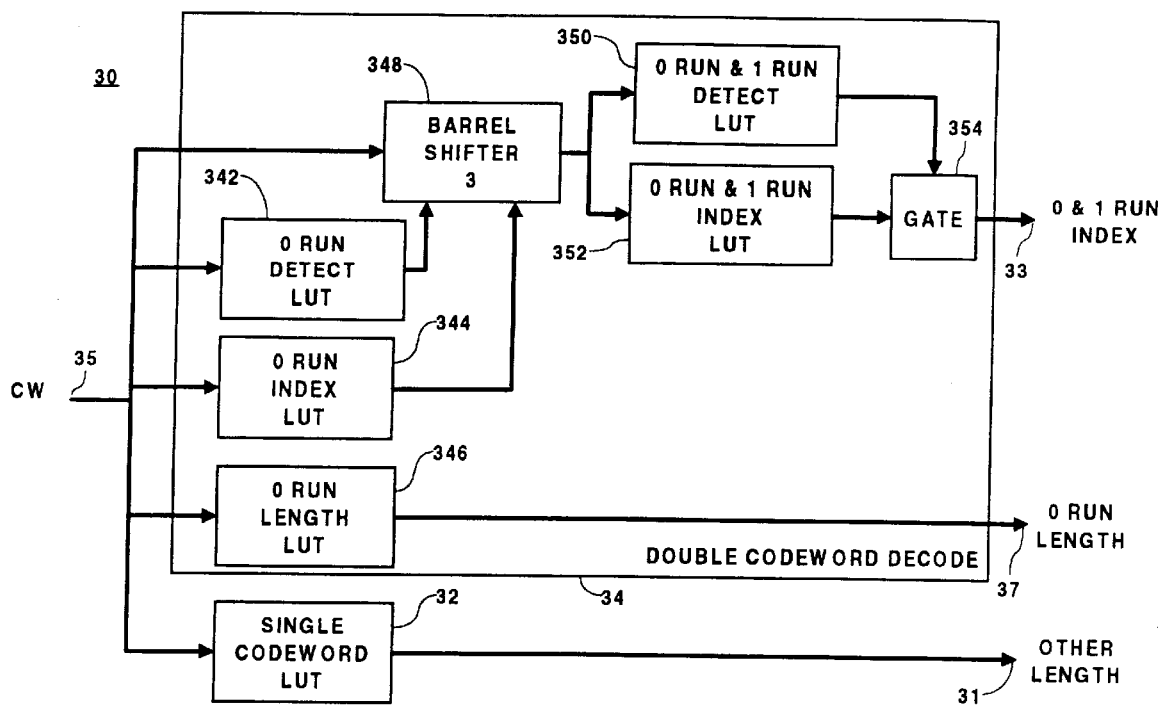

In FIG. 4, the output terminal of the register 27 (not shown) is coupled to the input terminal 35 of the length LUT 30 which receives data containing variable length codewords (CW) from the register 27. Input terminal 35 is coupled to an input terminal of a single codeword decoding LUT 32. An output terminal of the single codeword decoding LUT 32 is coupled to an output terminal 31. The input terminal 35 is also coupled to respective input terminals of a zero run codeword detector LUT 342, a zero run codeword index LUT 344, a zero run codeword length LUT 346, and a third barrel shifter 348. Respective output terminals of the zero run codeword detector LUT 342 and the zero run codeword index LUT 344 are coupled to control input terminals of the third barrel shifter 348. An output terminal of the third barrel shifter 348 is coupled to respective input terminals of a zero and one run codeword detector LUT 350 and a zero and one run codeword index LUT 352. An output terminal of the zero and one run codeword index LUT 352 is coupled to a data input terminal of a gate 354 and an output terminal of the zero and one run codeword detector LUT 350 is coupled to a control input terminal of the gate 354. An output terminal of the gate is coupled to an output terminal 33 of the length LUT 30. An output terminal of the zero run length LUT 346 is coupled to an output terminal 37 of the length LUT 30.

In operation, the single codeword decoding LUT 32 decodes the variable length codewords CW from the input terminal 35 which represent fixed length run-length encoded codewords having runs greater than one and generates a signal representing the length of the decoded codeword at output terminal 31, all in a known manner. The zero run length LUT 346 decodes the variable length codewords CW from the input terminal 35 which represent a zero run run-length codeword, and generates a signal at its output terminal representing the length of that codeword. FIG. 5 is a table representing the contents of the zero run run-length LUT 346. The left hand column represents the input codewords CW from the register 27 (of FIG. 2). Dashes ("-") represent "don't care" bits. The right hand column represents the length of recognized zero run run-length codewords. Because this table is relatively small, this data has a relatively short latency, and appears early in the clock cycle.

In order to decode the next sequential codeword, which may represent a zero or one run run-length codeword, the codewords CW from input terminal must be shifted by the width of the codeword recognized by the zero run codeword LUT 346 so that the next codeword occupies the lesser significant bits. The third barrel shifter 348 performs this shift. The third barrel shifter only operates when a zero run run-length codeword is recognized by the zero run codeword length LUT 346 detects a zero run codeword. As described above, there are only a limited number of lengths for such a codeword. Thus, in order to lower the latency time, the third barrel shifter 348 is implemented as a multiplexer. For example, in the illustrated embodiment, the inventor has realized that there are only thirteen possible lengths for a codeword representing a zero run run-length codeword. Thus the multiplexer forming the third barrel shifter 348 need only be a 13 input multiplexer. The zero run codeword index LUT 344 produces a 13 bit output signal, one bit for each of the possible lengths for a zero run codeword, i.e. in decoded format. The structure of the table is similar to that illustrated in FIG. 5. The output from the table is 13 bits, in which one bit represents all the codewords having the same length. One skilled in the art will understand how to modify the table of FIG. 5 to provide such an output.

Further, a zero run codeword detector LUT 342 provides a single bit output to indicate that the codeword at the input terminal 35 is a zero run codeword. The structure of this table, too, is similar to that in FIG. 5, except the output is a single bit which is a one for all the listed entries, and a zero otherwise. One skilled in the art will understand how to modify the table of FIG. 5 to provide such an output. Because the control signal from the zero run index LUT 344 is in de coded format, the multiplexer forming the third barrel shifter 348 may be implemented as 13 banks of AND gates. Each bank of AND gates may be arranged for shifting the input by a predetermined number of bits, and may be enabled by one of the bits from the zero run codeword index LUT 344 and the zero run codeword detected bit from the zero run codeword detect LUT 342. The third barrel shifter 348, when fabricated in this manner, operates with lower latency.

The zero and one run codeword index LUT 352 detects a second sequential codeword, either zero run or one run, in the shifted codewords CW from the third barrel shifter. The inventor has recognized that the second codeword, also, has only a limited number of possible lengths. Thus, the zero and one run codeword index LUT 352 also generates an index signal, in decoded format, in which each bit of the index signal represents a respective length of the second such codeword. FIG. 6 illustrates a table representing the contents of the zero and one run index LUT 352. In FIG. 6, a "-" represents a 'do not care' bit. In the illustrated embodiment, there are 14 possible second codeword lengths. The output signal from the zero and one run codeword index LUT 352, thus, includes 14 bits. The zero and one run codeword detector LUT 350 produces a single bit signal indicating the presence of a zero or one run codeword. The zero and one run codeword detector LUT 350 has a structure similar to that of the table illustrated in FIG. 6, except a single bit is active for each of the illustrated entries and inactive otherwise. One skilled in the art will understand how to modify the table illustrated in FIG. 6 to produce this signal. The gate 354 passes the index signal from the zero and one run codeword index LUT 352 when the signal from the zero and one run codeword detector LUT 350 indicates that such a codeword is present, otherwise no signal is passed by the gate 354. Because of the processing time inherent in the various LUTs illustrated in FIG. 4, the signal from the gate 354 appears relatively late in the clock cycle.

Referring again to FIG. 3, the length signal from the length LUT 30 is summed with the accumulator contents from the D flip-flop 284 in the summer 282. Similarly, the length signal from the length LUT 30 is used to control the shifting of the second barrel shifter 26. In order to minimize the latency time for the summation process and the shifting process, the structures of summer 282 and second barrel shifter are adapted to the structure of the length LUT 30, described above with reference to FIGS. 4, 5, and 6.

Figure 7:
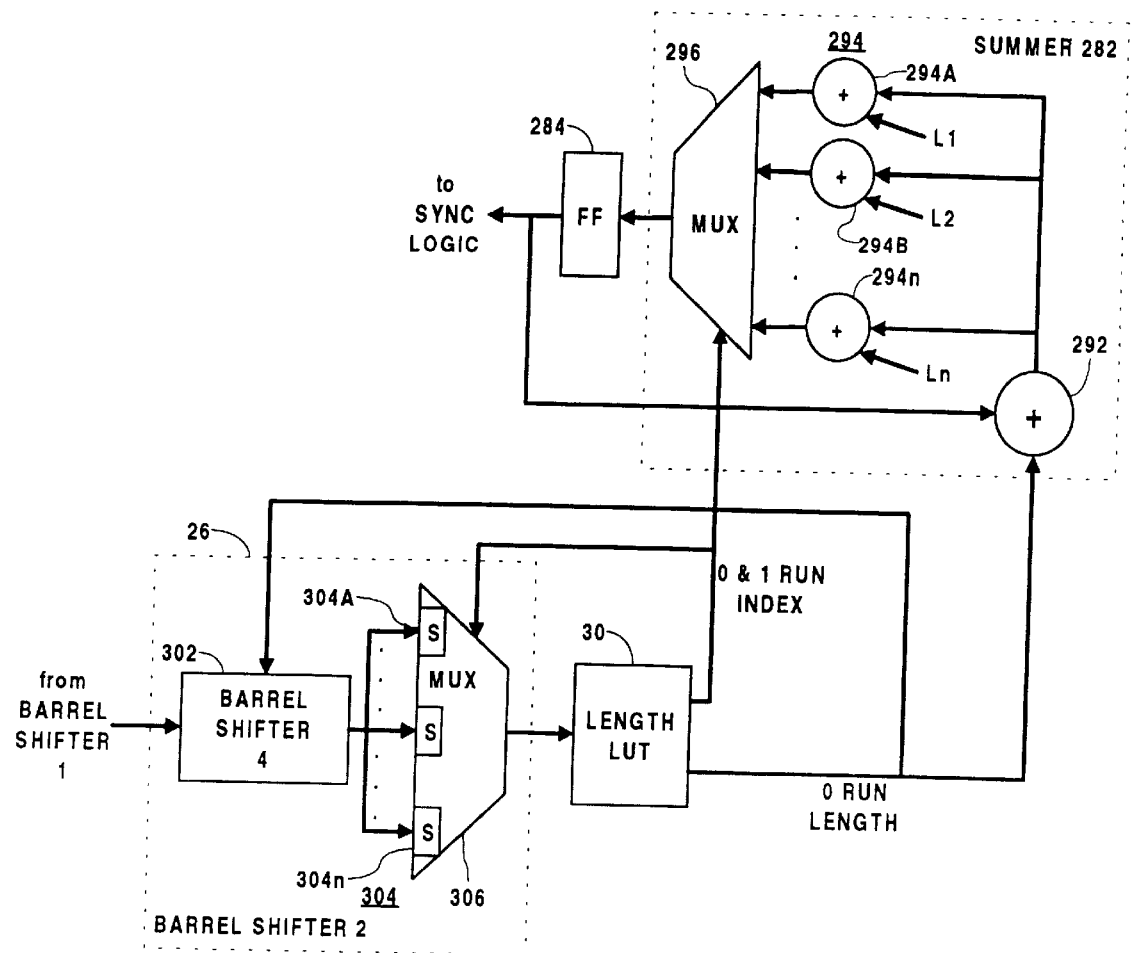
FIG. 7 is a more detailed block diagram of a portion of the VLD system illustrated in FIGS. 1 and 3.

FIG. 7 is a more detailed block diagram of a portion of the VLD system illustrated in FIGS. 1 and 3. In FIG. 7, the zero run codeword length from the zero run codeword length LUT 346 (of FIG. 4) in the length LUT 30 is coupled to a first input terminal of an adder 292 and a control input terminal of a barrel shift unit 302. An output terminal of the adder 292 is coupled in common to respective first input terminals of a plurality of adders 294: 294A, 294B ... 294n. Respective output terminals of the plurality of adders 294 are coupled to corresponding data input terminals of a first multiplexer 296. An output terminal of the multiplexer 296 is coupled to the input terminal of the accumulator D flip-flop 284. The output terminal of the accumulator D flip-flop 284 is coupled to a second input terminal of the adder 292. A plurality of sources of constant length signals are respectively coupled to second input terminals of each of the plurality of adders 294. That is, a source of a first constant length L1 is coupled to a second input terminal of a first one 294A of the plurality of adders 294; a source of a second constant length L2 is coupled to a second input terminal of a second one 294B of the plurality of adders 294; a source of an nth constant length Ln is coupled to the nth adder of the plurality of adders 294, and so forth.

An input terminal of the barrel shift unit 302 is coupled to the output terminal of the first barrel shifter 24 (not shown, of FIG. 2). An output terminal of the barrel shift unit 302 is coupled in common to respective input terminals of a second multiplexer 306. The combination of the barrel shift unit 302 and the multiplexer comprises the second barrel shifter circuit 26. An output terminal of the second multiplexer 306 is coupled to an input terminal of the length LUT 30. The zero and one run index from the gate 354 (of FIG. 4) in the length LUT 30 is coupled to respective control input terminals of the first multiplexer 296 and the second multiplexer 306.

In operation, the current value in the accumulator D flip-flop 284 is added to the zero run codeword length in the adder 292. Because these two values are available relatively early in the clock cycle, the adder 292 can produce its output value in sufficient time to propagate through the remainder of the circuit. However, because the length of the second consecutive zero or one run codeword is not available until relatively late in the clock cycle, due to the latency time inherent in the third barrel shifter 348 and LUTs 350 and 352 (of FIG. 4), processing of these values in an adder would not permit sufficient propagation time. Instead, the sum from the adder 292 is supplied to the plurality of adders 294 in parallel.

The respective second inputs L1–Ln to the parallel adders 294 represent one of the fixed number of possible lengths for the second consecutive zero or one run codeword. In the preferred embodiment, there are 14 possible lengths for the second codeword; thus, there are 14 parallel adders, each receiving at its second input terminal a value representing the length of the codeword corresponding to that adder. As de scribed above, the zero or one run codeword index signal is a 14 bit signal, in which each bit represents one of the possible lengths, and only one of the bits in the index signal is active at a time. This 14 bit index signal controls the first multiplexer 296. The first multiplexer 296 is fabricated by 14 banks of AND gates, each receiving the signal from a corresponding one of the plurality of adders 294, and enabled by a corresponding bit in the index signal. The output signal from the first multiplexer 296 is stored in the accumulator D flip-flop 284. Because operation of the first multiplexer 296 and 14 adders 294 each with one fixed value input is faster than the operation of a second full adder, this arrangement allows the addition of the length of the second zero or one run length codeword to the accumulator value within the interval of a single codeword.

It has also been determined that, although it initially seems that the 14 parallel adders 294 would require a lot of circuitry, when it is realized that each of the adders has one input that is a fixed value, logic minimizations may be applied which results in implementation of the illustrated circuit with only a minimal increase in circuitry over that of a full adder.

Similarly, the respective input terminals of the second multiplexer 306 receive codewords from the first barrel shifter each shifted by the length of the recognized first zero run codeword by the barrel shift unit 302. At each of the input terminals of the second multiplexer 306, this signal is further shifted by an amount representing one of the fixed number of possible lengths of the second consecutive zero or one run codeword. As described above, there are 14 possible lengths for the second codeword; thus, there are 14 input terminals, each receiving a codeword signal shifted by the length of the second codeword corresponding to that input terminal. This shifting is performed in a known manner by hardwiring the signal from the output terminal of the barrel shift unit 302 to the input terminal of the second multiplexer 306, shifted by the appropriate number of bit positions, as represented by the small boxes labeled "S". As described above, the zero or one run codeword index signal is a 14 bit signal, in which each bit represents one of the possible lengths, and only one of the bits in the index signal is active at a time. This 14 bit index signal controls the second multiplexer 306. The second multiplexer 306 is fabricated by 14 banks of AND gates enabled by a corresponding bit in the index signal. The output signal from the second multiplexer 306 represents the next undecoded codeword, and is supplied to the length LUT 30. Because operation of the second multiplexer 306 is faster than the operation of a barrel shifter, this arrangement allows the next undecoded codeword to be supplied to the length LUT 30 within the interval of a single codeword.

What is claimed is:

1. A variable length codeword decoder, responsive to a clock signal having multiple cycles, comprising:

source of sequential variable length codewords, each representing a run-length encoded codeword;

a barrel shifter circuit, responsive to said clock signal, coupled to the codeword source, for providing at least a first variable length codeword, to be decoded next, and a second variable length codeword, to be decoded next after the first variable length codeword, at an output terminal;

a codeword decoding circuit, coupled to the output terminal of the barrel shifter, for decoding in a single cycle of said clock signal, at least one of:

(a) first and second variable length codewords, each representing respective zero run run-length codewords; and (b) a first sequential variable length codeword representing a zero run run-length codeword and a second variable length codeword representing a one run run-length codeword.

2. The decoder of claim 1 wherein said codeword decoding circuit decodes other variable length codewords, other than codewords representing zero run run-length and one run run-length codewords, on a one per clock cycle basis.

3. The decoder of claim 1 wherein the codeword decoding circuit comprises:

a value look up table, coupled to the output terminal of the barrel shifter, for generating data representing the run-length codeword represented by the variable length codeword; and a length look up table, coupled to the output terminal of the barrel shifter, for generating data representing the length of the variable length codeword.

4. The decoder of claim 3 wherein the length lookup table comprises:

a first lookup table for generating data representing the length of a first variable length codeword representing zero run run-length codewords;

a second lookup table for generating data representing the length of a second variable length codeword, next sequential to the first variable length codeword, and representing one of a zero run run-length codeword and a one run run-length codeword; and a third lookup table for generating data representing the length of all other variable length codewords.

5. The decoder of claim 3 wherein the barrel shifter circuit comprises:

a first barrel shifter, coupled to the codeword source and responsive to the length look up table; and a second barrel shifter, coupled between the first barrel shifter and the output terminal of the barrel shifter circuit, and responsive to the length look up table; wherein:

the second barrel shifter produces the next undecoded variable length codeword at the lesser significant bits of the output terminal of the barrel shifter circuit; and the first barrel shifter maintains the next codeword from the codeword source at a trailing edge of the codeword in the second barrel shifter.

6. The decoder of claim 5 further comprising a register, coupled between the second barrel shifter and the length look up table and responsive to the clock signal, wherein the second barrel shifter is responsive to the output of the register for producing the next undecoded variable length codeword at lesser significant bits of the output terminal.

7. The decoder of claim 5 further comprising:

an accumulator coupled between the length look up table and the first barrel shifter; wherein:

the first barrel shifter operates in response to the accumulator; and the second barrel shifter operates in response to the length look up table.

8. The decoder of claim 7 wherein:

the length lookup table comprises:
- a first lookup table for generating data representing the length of a first variable length code word representing a zero run run-length codeword; and
- a second lookup table for generating data representing the length of a second variable length code word, next sequential to the first variable length codeword, and representing one of a zero run run-length codeword and a one run run-length codeword; and the accumulator comprises:
- a latch, responsive to the clock signal;
- a first adder circuit, having a first input terminal coupled to the latch, a second input terminal coupled to the first lookup table and an output terminal;
- a second adder circuit, having a first input terminal coupled to the output terminal of the first adder, a second input terminal coupled to the second lookup table, and an output terminal coupled to the latch.

9. The decoder of claim 8 wherein:

the first lookup table produces a signal having a value of the length of the first variable length codeword;

the second variable length codeword can be one of a plurality of lengths, and the second lookup table produces an index signal having respective values corresponding to the plurality of lengths of the second variable length codeword; and the second adder circuit comprises:
- a plurality of adders, respectively corresponding to the plurality of lengths of the second variable length codeword, having respective first input terminals coupled in common to the output terminal of the first adder circuit, respective second input terminals coupled to receive corresponding input signals having respective values of one of the plurality of lengths of the second variable length code words, and output terminals; and
- a multiplexer, having a plurality of input terminals coupled to the output terminals of corresponding ones of the plurality of adders, a control input terminal responsive to index signal from the second lookup table, and an output terminal coupled to the latch.

10. The decoder of claim 9 wherein:

the index signal is a multibit signal having respective bits corresponding to one of the plurality of lengths;

the multiplexer comprises a plurality of AND gates, corresponding to the plurality of lengths, each having a first input terminal coupled to a corresponding one of the adders, a second input terminal responsive to a respective one of the bits in the index signal, and an output terminal coupled to the latch.

11. The decoder of claim 8 wherein:

the first lookup table produces a signal having a value of the length of the first variable length codeword;

the second variable length codeword can be one of a plurality of lengths, and the second lookup table produces an index signal having respective values corresponding to the plurality of lengths of the second variable length codeword; and the second barrel shifter comprises:
- a third barrel shifter, coupled to the first barrel shifter; and
- a multiplexer, having a plurality of input terminals coupled to the third barrel shifter, each respective input terminal receiving a signal from the third barrel shifter shifted by a number of bits representing a corresponding one of the plurality of lengths of the second variable length codeword, a control input terminal responsive to the index signal from the second lookup table, and an output terminal coupled to the output terminal of the barrel shifter circuit.

12. The decoder of claim 11 wherein:

the index signal is a multibit signal having respective bits corresponding to one of the plurality of lengths;

the multiplexer comprises a plurality of AND gates, corresponding to the plurality of lengths, each having a first input terminal coupled to a corresponding one of the plurality of input terminals of the multiplexer, a second input terminal responsive to a respective one of the bits in the index signal, and an output terminal coupled to the output terminal of the barrel shifter circuit.

13. In a variable length codeword decoder processing sequential variable length codewords, each representing a run-length encoded codeword, and responsive to a clock signal having multiple cycles, a method for decoding the variable length codewords, comprising the steps of:

extracting at least a first and a second variable length codeword next to be decoded, in a single clock cycle of said clock signal;

detecting if the first variable length codeword represents a zero run run-length encoded codeword, in said single clock cycle of said clock signal;

if the first variable length codeword does not represent a zero run run-length encoded codeword then, in a single clock cycle of said clock signal:
- looking up the length of the run-length codeword represented by the first variable length codeword in a first look up table; and
- extracting at least a first and a second variable length codeword next to be decoded by shifting the sequential variable length codewords by the length of the first variable length codeword;

if the first variable length codeword represents a zero run run-length encoded codeword then, in a single clock cycle of said clock signal:
- looking up the length of the run-length codeword represented by the first variable length codeword in a second look up table;
- detecting if the second variable length codeword represents one of a zero run run-length codeword and a one run run-length codeword;
- if the second variable length codeword does not represent one of a zero run run-length codeword and a one run run-length codeword, extracting at least a first and a second variable length codeword next to be decoded by shifting the sequential variable length codewords by the length of the first variable length codeword;
- if the second variable length codeword represents one of a zero run run-length codeword and a one run run-length codeword
  - looking up the length of the run-length codeword represented by the second variable length codeword in a third look up table;
  - combining the respective lengths of the second variable length codeword and the first variable length codeword;

extracting at least a first and a second variable length codeword next to be decoded by shifting the sequential variable length code words by the combined lengths of the first and second variable length codewords.

14. The method of claim 13 further comprising the steps of:
if the first variable length codeword does not represent a zero run run-length encoded codeword looking up the value of the first run-length encoded codeword in a value look up table;
if the first variable length codeword represents a zero run run-length encoded codeword:
   looking up the value of the first run-length encoded codeword in the value look up table; and
   if the second variable length codeword represents one of a zero run run-length codeword and a one run run-length codeword looking up the value of the second run-length encoded codeword in the value look up table.

15. The method of claim 13 wherein:
the second variable length codeword has one of a predetermined number of lengths;
the step of looking up the value of the second variable length codeword comprises looking up an index representing the one of the predetermined number of lengths of the second variable length codewords; and
the step of extracting at least a first and a second variable length codeword next to be decoded by shifting the sequential variable length codewords by the combined lengths of the first and second variable length codewords comprises the steps of:
   preshifting the sequential variable length code words by the length of the first variable length codeword;
   generating the predetermined number of versions of the preshifted sequential variable length code words, each version further shifted by a respective one of the predetermined number of lengths of the second variable length codewords; and
   selecting the shifted version corresponding to the index as the shifted variable length codewords.

16. The method of claim 13 wherein:
the second variable length codeword has one of a predetermined number of lengths;
the step of looking up the value of the second variable length codeword comprises looking up an index representing the one of the predetermined number of lengths of the second variable length codewords; and
the step of combining the lengths of the first and second variable length codewords comprises adding the length of the first variable length codeword to each of the predetermined number of lengths to form the predetermined number of sums, and selecting the one of the predetermined number of sums corresponding to the index as the combined length of the first and second variable length codewords.

* * * * *